United States Patent [19]

Yamada et al.

[11] 4,379,995
[45] Apr. 12, 1983

[54] GAIN CONTROLLED AMPLIFIER

[75] Inventors: Hisashi Yamada, Yokohama; Tsutomu Sugawara, Yokosuka, both of Japan

[73] Assignee: Tokyo Shibaura Denki Kabushiki Kaisha, Kawasaki, Japan

[21] Appl. No.: 187,490

[22] Filed: Sep. 16, 1980

[30] Foreign Application Priority Data

Sep. 21, 1979 [JP] Japan .................................. 54-121865

[51] Int. Cl.³ .......................... H03F 3/45; H03G 3/10
[52] U.S. Cl. .................................... 330/254; 330/284
[58] Field of Search .............. 330/254, 257, 268, 274, 330/278, 284, 295

[56] References Cited

U.S. PATENT DOCUMENTS 3,757,240  9/1973  Fogg .................................. 330/254

Primary Examiner—James B. Mullins
Assistant Examiner—Gene Wan
Attorney, Agent, or Firm—Oblon, Fisher, Spivak, McClelland & Maier

[57] ABSTRACT

A gain controlled amplifier comprising a first means for providing a first current and a second current corresponding to an input signal, a second means for providing a first attenuated current corresponding to the first current, a third means for providing a second attenuated current corresponding to the second current, a fourth means for providing a control signal for changing magnitude of the first and second attenuated currents, and fifth means for providing an output signal corresponding to amplitudes of the first and second attenuator currents. The first means comprises a split current generator for separately providing the first current corresponding to the positive component of the input signal and the second current corresponding to the negative component of the input signal.

11 Claims, 2 Drawing Figures

GAIN CONTROLLED AMPLIFIER

BACKGROUND OF THE INVENTION

1. Field of the Invention

The present invention relates to a gain controlled amplifier with an improved S/N ratio well adaptable for integrated circuits.

2. Description of the Prior Art

As a gain controlled amplifier (GCA) requiring a wide dynamic range or a wide gain controlled range, there has been known a log/exp type gain controlled amplifier by using a logarithmic conversion and an exponential conversion. By the log/exp GCA, a wide gain controlled range is obtained indeed. When there is a poor coincidence of the exponential function characteristic between the logarithmic and exponential conversions, a poor analogy is present between the profiles of the input and output signal waveforms, however. Particularly when the characteristic of the paired transistors of NPN to control the positive half period of the input signal is not well coincident with that of the paired transistors of PNP to control the negative half period of the input signal, there occurs an asymmetircal distortion between the positive and negative periods. Generally, the frequency characteristic of the PNP transistor is poorer than that of the NPN transistor. In the GCA containing NPN transistors and PNP transistors respectively in the feedback circuits, the asymmetrical distortion becomes larger as the input signal frequency is higher. For this reason, when the log/exp type GCA is used for an audio amplifier of HiFi use, the discrete dual NPN and PNP transistors must frequently be selected in their characteristics so as to lessen the asymmetrical distortion. This makes it difficult to fabricate the log/exp type GCA by the IC.

One of the prior arts attempted solution of the problem of the log/exp type GCA, i.e. the difficulty of the IC fabrication of the low distortion type GCA, is an Automatic Gain Control RF-IF amplifier disclosed in the U.S. Pat. No. 3,684,974. In the AGC amplifier disclosed in the patent, all the active elements may be formed by NPN transistors. Further, a signal transmission path for the positive half period of the input signal is identical with or symmetrical with that for the negative half period of the input signal. Therefore, it is estimated that the AGC amplifier of the USP is easy in the IC fabrication, and has a good frequency characteristic and a little distortion. To obtain those features for advantages, however, an idling current or bias current more than a maximum peak value of the input signal current must constantly be fed into the AGC circuit. When the idling current is too small, when the signal current larger than the idling current is inputted, part of the AGC circuit is cut off to cause a clipping distortion. When the constant flow of sufficiently large idling current is allowed in the circuit for preventing the clipping distortion, an additional problem arises that the shot noise (white noise) of the active elements forming the AGC circuit increases as the idling current is larger, resulting in deterioration of the S/N ratio. The deterioration of the S/N ratio implies that the dynamic range is narrowed. Thus, the AGC amplifier disclosed in the above patent has advantages of the easy IC fabrication and the low distortion but has a disadvantage that it is difficult to take a wide dynamic range.

SUMMARY OF THE INVENTION

Accordingly, an object of the present invention is to provide a gain controlled amplifier with the improved S/N ratio adaptable for the IC fabrication.

To achieve the above object, the gain controlled amplifier according to the invention employs a circuit configuration in which there is no need for applying the idling current causing the shot noise to an attenuator element. Specifically, the gain controlled amplifier comprising: (a) first means for separately providing a first current corresponding to the positive component of an input signal and a second current corresponding to the negative component; (b) second means connected to the first means for providing a first attenuated current corresponding to the first current; (c) third means connected to the first means for providing a second attenuated current corresponding to the second current; (d) fourth means connected to the second and third means for providing a control signal for changing magnitudes of the first and second attenuated currents; and (e) fifth means connected to the second and third means for providing an output signal corresponding to the first and second attenuated currents.

The gain controlled amplifier with such an arrangement can effect the gain control free from the clipping distortion without the idling current flow. This will be better understood when considering a relation between the class A single amplifier and the class B push-pull amplifier in the field of an analog amplifier. In the class A single operation, the clipping will occur in the positive or negative part of the input signal, if an insufficient amount of the idling current flows in the AGC circuit. On the other hand, in the class B push-pull operation, the input signal will never be clipped even if the idling current is zero. For example, in the class B single ended push-pull (SEPP) circuit, the NPN transistor stage amplifies only the positive half-period of the input signal, while the PNP transistor stage amplifies only the negative half-period. In this case, in the class B SEPP circuit, the peak of the input signal is never clipped even if the idling current is zero. The present invention that the first and second currents are separately produced and those currents, respectively, are controlled in the second and third means, may be analogous in operation to the class B SEPP. The first current corresponding to the positive component of the input signal is controlled in the second means. In this case, there is no need for operating the third means. On the other hand, the second current corresponding to the negative component of the input signal is controlled by the third means. In this case, there is no need for operating the second means. The currents controlled by the second and third means are composed by the fifth means, so that an output signal analogous to the input signal is produced. In this way, the gain control without the clipping is possible without the idling current flow.

As described above, the gain controlled amplifier according to the present invention can reduce to zero the first and second currents when the idling current, i.e. the input signal, is zero. Accordingly, the shot noise may be reduced when the input signal is zero.

As a typical example of the detailed constructions to zero the idling current, the gain controlled amplifier according to the present invention comprises an amplifier whose non-inverted input is connected to a ground circuit with zero voltage potential; an input impedance provided between the input signal and the inverted input of the amplifier; a first transistor of a first conductivity type whose base and collector are connected to the inverted input of the amplifier and whose emitter is connected to the output of the amplifier so that the base-emitter path of the first transistor constitutes a negative feedback loop and the inverted input of the amplifier is an imaginary ground; a second transistor of the first conductivity type for providing a first current, whose base and emitter are respectively connected to the base and emitter of the first transistor so that the first and second transistors constitute a current mirror circuit; and a third transistor of the first conductivity type for providing a second current, whose emitter is connected to the inverted input of the amplifier and whose base is connected to the output of the amplifier so that the base-emitter path of the third transistor constitutes a negative feedback loop and the inverted input of the amplifier is an imaginary ground; whereby the magnitude of the first and second currents is substantially zero and the first and second currents cause no shot noise when the amplitude of the input signal is zero.

With the circuit arrangement, the potential at the inverted input of the amplifier is zero (imaginary ground). Accordingly, if the amplitude of the input signal is zero, the potential difference between the input impedance is zero. As a result, the idling current or the first and second currents become zero.

BRIEF DESCRIPTION OF THE DRAWINGS

Other objects and features of the present invention will be apparent from the following description taken in connection with the accompanying drawings, in which.

DETAILED DESCRIPTION OF THE PREFERRED EMBODIMENTS

Figure 1:
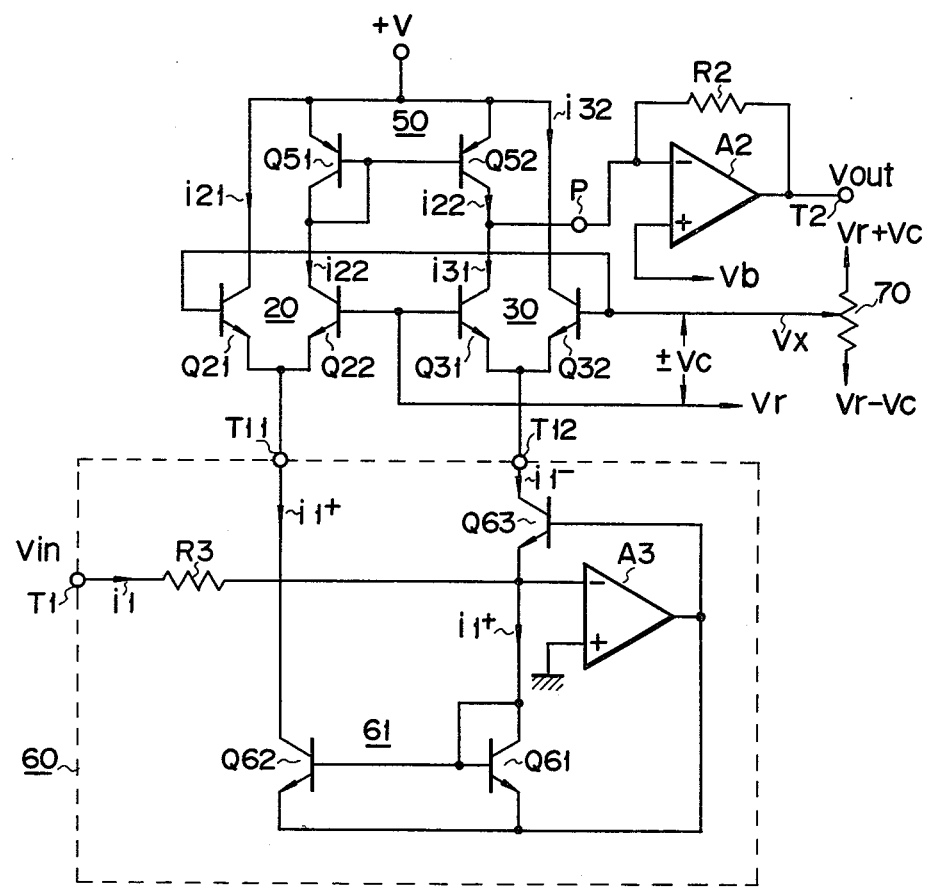
FIG. 1 shows a circuit diagram of an embodiment of a gain controlled amplifier according to the present invention.

FIG. 1 shows a gain controlled amplifier according to the present invention. An input signal Vin inputted to a terminal T1 is applied through a resistor R3 to the inverted input of an amplifier A3. The non-inverted input of the amplifier A3 is grounded. The inverted input is connected through a base-emitter path of a diode-connected NPN transistor Q61 to the output of the amplifier A3. The base and emitter of the transistor Q61, respectively, are connected to the base and emitter of an NPN transistor Q62. The collector of the transistor Q62 is connected to a terminal T11. The transistors Q61 and Q62 form a currrent mirror circuit 61. The inverted input of the amplifier A3 is connected through an emitter-base path of an NPN transistor Q63 to the output thereof. The collector of the transistor Q63 is connected to a terminal T12. The transistors Q61 and Q63 are inserted in a negative feedback loop of the amplifier A3. The negative feedback operation through the transistors Q61 and Q63, the inverted input of the amplifier A3 serves as an imaginary ground. Therefore, when the input signal Vin is absent, that is, the signal Vin is at zero level, an input current i1 flowing through the resistor R3 is zero.

When the input signal Vin is not zero, the current i1 with the direction and magnitude corresponding to the voltage potential of the signal Vin, flows through the resistor R3. When the signal Vin is positive, a positive current i1 (=i1+) flows from the terminal T1 to the inverted input of the amplifier. At this time, the output potential of the amplifier A3 reduces. In turn, the transistor Q63 is turned off while the transistor Q61 is turned on. If the input impedance of the amplifier A3 is considered to be infinite, the current i1+ flows into only the transistor Q61. If the transistors Q61 and Q62 performs an ideal current mirror operation, the collector current of the transistor Q62 is equal to the current i1+. When the signal Vin is negative, a negative input current i1 (=i1−) flows from the emitter of the transistor Q63 to the terminal T1. At this time, the output potential of the amplifier A3 rises, so that the transistor Q61 is turned off and the transistor Q63 is turned on. In this case, the current i1− flows only through the transistor Q63.

The components R3, A3 and Q61 to Q63 form a first means or a split current generator 60 for providing a first current i1+ corresponding a positive component of the input signal Vin and a second current i1− corresponding to the negative component thereof.

Connected to the terminal T1 are the emitters of NPN transistors Q21 and Q22. The transistors Q21 and Q22 form a differential transistors pair 20. The base of the transistor Q22 is connected to a reference potential Vr. The base of the transistor Q21 is connected to a slider of a variable resistor 70. Fixed potentials Vr+Vc and Vr−Vc are applied between the ends of the resistor 70. The slider potential Vx of the resistor 70 changes between the fixed potentials. In other words, between the bases of the transistors Q21 and Q22 is produced a potential difference ±Vc at maximum.

The collector of the transistor Q21 is connected to a positive power potential +V. The collector of the transistor Q22 is connected through the base-emitter path of a diode-connected PNP transistor Q51 to the power potential +V. To the base and emitter of the transistor Q51 are connected the base and emitter of a PNP transistor Q52. The collector of the transistor Q52 is connected to a connection point P. The transistors Q51 and Q52 form a current mirror circuit 50. When the circuit 50 performs an ideal current mirror operation the collector current of the transistor Q52 is equal to the collector current of the transistor Q22. The collector current of the transistor Q52 is equal to the collector current of the transistor Q22. With such a circuit configuration, if the current amplification factor $h_{fe}$ of the transistors Q21 and Q22 is sufficiently large, the sum of a collector current i21 of the transistor Q21 and a collector current i22 of the transistor Q22 is equal to the common emitter current or the first current i1+.

The components Q21, Q22, Q51 and Q52 are connected to the first means 60 and those form a second means for providing a first attenuated current i22 corresponding to the first current i1+.

To the terminal T12 are connected the emitters of NPN transistors Q31 and Q32. The transistors Q31 and Q32 form a differential transistors pair 30. The reference potential Vr is applied to the base of the transistor Q31 and the slider potential Vx is applied to the base of the transistor Q32. The collector of the transistor Q32 is connected to the power potential +V and the collector of the transistor Q31 is connected to the connection point P. If the current amplification factor $h_{fe}$ of the transistors Q31 and Q32 is sufficiently large, the sum of a collector current i31 of the transistor Q31 and a collector current i32 of the transistor Q32 is equal to the common emitter current or the second current i1−.

The components Q31 and Q32 are connected to the first means 60 and form a third means for providing a second attenuated current i31 corresponding to the second current i1−.

The connection point P is connected to the inverted input of an amplifier A2. To the point P, the first attenuated current i22 and the second attenuated current i31 flow. The non-inverted input of the amplifier A2 is connected to a bias potential Vb. The inverted input of the amplifier A2 is connected through a resistor R2 to the output thereof. The output of the amplifier A2 is connected to a terminal T2 from which an output signal Vout is derived.

The components R2 and A2 are connected to the second and third means and form a fifth means for providing an output signal Vout corresponding to the amplitudes of the first and second attenuated currents i22 and i31.

The operation of the gain controlled amplifier shown in FIG. 1 will be given. The operation of the differential transistors pair 20 is exactly the same as that of the differential transistors pair 30. Therefore, the explanation to follow is related only to the attenuation operation of the transistors pair 20.

In FIG. 1, a current attenuation ratio G is defined as follows:

$$G = i22/i21 \tag{1}$$

In the positive half period of the input signal Vin, the following equation holds $$i1+ = i21 + i22 \tag{2}$$

From the equations (1) and (2), we have $$i22 = G/(1+G) \times i1+ \tag{3}$$

As will be recalled, the inverted input of the amplifier A3 is the imaginary ground, i.e. zero potential and therefore the following equation holds $$i1 = Vin/R3 \tag{4}$$

Substituting the equation (4) into the equation (3), we have $$i22 = Vin/R3 \times G/(1+G) \tag{5}$$

The case under discussion is that the signal Vin is positive. Therefore, it is considered that the transistors Q63, Q31 and Q32 are all cut off. Accordingly, the attenuated current i22 flows into the resistor R2 from the point P to the terminal T2. The current i22 in this direction reduces the potential of the signal Vout. That is, the current i22 grows large as the potential of the signal Vin increases in the positive direction. The increase of the i22 reduces the potential of the signal Vout. This indicates that the input signal Vin and the output signal Vout are out of phase (anti-phase) each other. Since the source impedance (AC impedance) of the bias potential Vb is zero, a change of the Vout is given $$Vout = -R2 i22 \tag{6}$$

From the equations (5) and (6), a gain or a transfer function $G_T$ from the terminal T1 to the terminal T2 is given by $$G_T = Vout/Vin = -R2/R3 \times G/(1+G) \tag{7}$$

The equation (7) indicates that the gain $G_T$ is a function of the current attenuation ratio G.

A relation between the parameter G in the equation (7) and the voltage difference Vr−Vx will be discussed. The following approximate equation holds between the base potentials Vx and Vr of the transistors Q21 and Q22 and the collector currents i21 and i22.

$$i21 \propto \exp\left(\frac{qVx}{KT} - 1\right) \approx \exp\left(\frac{qVx}{KT}\right) \tag{8}$$

$$i22 \propto \exp\left(\frac{qVr}{KT} - 1\right) \approx \exp\left(\frac{qVr}{KT}\right) \tag{9}$$

where q = magnitude of the charge of an electron
K = Boltzman's constant
T = absolute temperature in degrees Kelvin By substituting the equations (8) and (9) into the equation (1), we have $$G = \frac{i22}{i21} \approx \frac{\exp\left(\frac{qVr}{KT}\right)}{\exp\left(\frac{qVx}{KT}\right)} = \exp\left\{\frac{q}{KT}(Vr - Vx)\right\} \tag{10}$$

The equation (10) indicates that the parameter G is a function of the potential Vx. That is, the gain $G_T$ in the equation (7) is also a function of the potential Vx.

Assume now that Vr−Vx = −Vc (>0) and qVc >> KT (normally qVc ≧ 3KT). In this case, the equation (10) provides G ≈ 0. When G = 0, so assumed, is substituted into the equation (7), Gt = 0. In other words, when Vx > Vr and the voltage difference Vc is large enough, $G_T$ = 0. When Vr − Vx = 0, the equation (10) provides a relation G ≈ 1.

The equation (7) gives the $G_T$ at this time $$G_T \bigg|_{G=1} = -\frac{1}{2} \frac{R2}{R3} \tag{11}$$

Here, Vr−Vx = Vc (>0) and qVc >> KT, the equation (10) gives a relation G ≈ ∞. Substituting G = ∞ into the equation (7), $G_T$ = −R2/R3.

As seen from the foregoing, by changing a voltage difference between the bases of the transistors Q21 and Q22 between ±Vc through the operation of the variable resistor 70, the gain $G_T$ may be properly changed from 0 to −R2/R3.

If the transistors pairs 20 and 30 are identical with each other, the operation of those during the negative half period of the input signal Vin are as described above. In this case, the current attenuation ratio G is $$G = i31/i32 \tag{1A}$$

The gain $G_T$ has a same form as that of the equation (7). In the construction shown in FIG. 1, the gain $G_T$ is varied by changing the parameter G in accordance with the voltage difference Vr−Vx.

The component 70 is connected to the second and third means, and forms a fourth means for changing the first and second attenuated currents i22 and i31.

Two important features in the circuit arrangement shown in FIG. 1 are:

(1) As seen from the equation (4), when Vin=0, i1+ =0 and i1− is also 0. Therefore, when Vin=0, no collector currents flow into the transistors Q21–Q22, Q51–Q52 and Q31–Q32. The result is that a very small amount of shot noise is produced from those transistors. The collector output impedance of the transistors Q52 and Q31 is very large. Accordingly, the negative feedback of about 100% is applied to the amplifier A2, so that the noise of the amplifier A2 per se is very small.

(2) As indicated by the equation (10), the parameter G has no relation to the input signal Vin if the transistors Q21, Q22, Q31 amd Q32 have ideal exponential characteristics. Hence, the parameter G is not related to the distortion factor of the gain controlled amplifier. As indicated by the equation (7), the gain $G_T$ is a function of only the resistors R2, R3 and the parameter G. Accordingly, the gain controlled amplifier shown in FIG. 1 has a low distortion and a wide range of the frequency characteristic.

If one desires a non-flat frequency characteristic, all one has to do is to employ the impedance network of L, C and/or R in place of the resistors R2 and/or R3.

Figure 2:
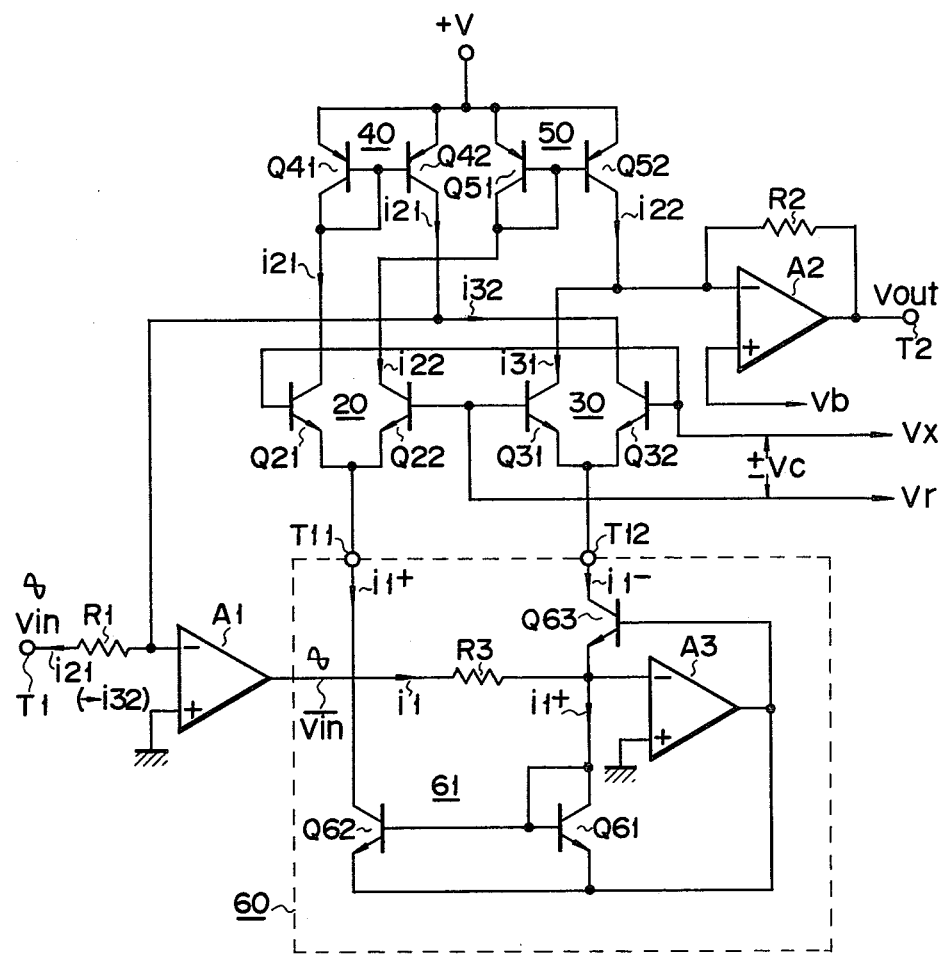
FIG. 2 shows a circuit diagram of another embodiment of the gain controlled amplifier according to the present invention.

FIG. 2 is another embodiment of the gain controlled amplifier according to the present invention. Common parts or portions between the FIGS. 1 and 2 are designated by like reference symbols, for simplicity.

An input signal Vin inputted to a terminal T1 is applied through an input resistor R1 to the inverted input of an amplifier A1. The non-inverted input of the amplifier A1 is grounded. The output of the amplifier A1 is connected through a resistor R3 to the inverted input of an amplifier A3. The collector of an NPN transistor Q21 is connected through the base-emitter path of a diode-connected PNP transistor Q41 to a positive power potential +V. To the base and emitter of the transistor Q41 are connected the base and emitter of a PNP transistor Q42. The collector of the transistor Q42 is connected to the inverted input of the amplifier A1. The inverted input is also connected to the collector of an NPN transistor Q32.

A third current i21 corresponding to a difference between the first current i1+ and the first attenuated current i22, and a fourth current i32 corresponding to a difference between the second current i1− and the second attenuated current i31 are fed back to the components R1, A1, Q41 and Q42. Those components also constitute a sixth means or a signal converter for providing an input current i1 corresponding to the input signal Vin to the first means or the split current generator 60.

Let us consider a case that as in the case of FIG. 1, an output signal $\overline{Vin}$ of the amplifier A1 is positive. In this case, the transistors pair Q21 and Q22 is active while the transistors pair Q31 and Q32 is inactive. When the base potentials of the transistors Q21 and Q22 are equal to each other, that is, Vr=Vx, the current attenuation ratio G is 1 as seen from the equation (10). Hence, from the equations (1) and (2), i21 is given $$i21 = i22 = \tfrac{1}{2} \times i1+ \tag{12}$$

When the signal $\overline{Vin}$ is positive, i.e. the signal Vin is negative, the current i21 flows from the collector of the transistor Q42 to the terminal T1. The inverted input of the amplifier A1 is the imaginary ground, so that the following equation holds $$Vin = -R1 i21 \tag{13}$$

When the equation (12) is substituted into the equation (13), we have $$Vin = -\tfrac{1}{2} \times R1 i1+ \tag{14}$$

Further, when the equation (12) is substituted into the equation (6), we have $$Vout = -\tfrac{1}{2} \times R2 i1+ \tag{15}$$

From the equations (14) and (15), when G=1 or Vr=Vx, the gain $G_T$ is $$G_T \Big|_{G=1} = \frac{Vout}{Vin} = \frac{R2}{R1} \tag{16}$$

When comparing the equation (11) with the equation (16), the following will be understood; when R1=R3, the amplifier of FIG. 2 has the double gain of the amplifier shown in FIG. 1. This indicates that if the noise produced from the amplifier A1 is sufficiently small, the input-conversion noise level of the amplifier of FIG. 2 is small than that of FIG. 1. In other words, the FIG. 2 amplifier may be designed to have a more wide dynamic range.

Although specific constructions have been illustrated and described herein, it is not intended that the invention be limited to the elements and constructions disclosed. One skilled in the art will recognize that other particular elements or subconstructions may be used without departing from the scope and spirit of the invention.

For example, the potential Vx may be a DC signal obtained by rectifying the signal Vin or Vout. In this case, an AGC circuit or a volume expander may be formed by the amplifier shown in FIG. 1 or 2. The differential transistors pair (20, 30) may be replaced by other active elements such as FETs. The resistors for current balance may be inserted into the current mirror circuits (61, 40, 50). Further, DC bias may be applied to those transistors in order that when the signal Vin is minute, all the transistors Q61 to Q63 are rendered slightly conductive for suppressing a switching distortion.

What is claimed is:

1. A gain controlled amplifier comprising:
  (a) first means for separately providing a first current corresponding to the positive component of an input signal and a second current corresponding to the negative component of said input signal;
  (b) second means connected to said first means for providing a first attenuated current corresponding to said first current;
  (c) third means connected to said first means for providing a second attenuated current corresponding to said second current;
  (d) fourth means connected to said second and third means for providing a control signal for changing magnitude of said first and second attenuated currents;

(e) fifth means connected to said second and third means for providing an output signal corresponding to said first and second attenuated current;

(f) sixth means coupled to said first, second and third means, said sixth means being responsive to a third current which corresponds to a difference between said first current and said first attenuated current, and said sixth means also being responsive to a fourth current which corresponds to a difference between said second current and said second attenuated current, said sixth means providing said first means with an input current corresponding to said input signal.

2. A gain controlled amplifier of claim 1, wherein said sixth means includes:
a first amplifier whose non-inverted input is connected to a ground circuit with zero voltage potential and whose inverted input is provided with said fourth current;
a first input impedance provided between said input signal and the inverted input of said first amplifier; and
a first current mirror circuit connected to said second means, for providing said third current to the inverted input of said first amplifier.

3. A gain controlled amplifier of claim 1, or 2, wherein said first means includes:
a second amplifier whose non-inverted input is connected to a ground circuit with zero voltage potential;
a second input impedance provided between said input signal and the inverted input of said second amplifier;
a first transistor of a first conductivity type whose base and collector are connected to the inverted input of said second amplifier and whose emitter is connected to the output of said second amplifier so that the base-emitter path of said first transistor constitutes a negative feedback loop and the inverted input of said second amplifier is an imaginary ground; and
a second transistor of the first conductivity type for providing said first current, whose base and emitter are respectively connected to the base and emitter of said first transistor so that said first and second transistors constitute a second current mirror circuit, whereby
the magnitude of said first current is substantially zero and said first current causes no shot noise when the amplitude of said input signal is zero.

4. A gain controlled amplifier of claim 1, or 2, wherein said first means includes:
a second amplifier whose non-inverted input is connected to a ground circuit with zero voltage potential;
a second input impedance provided between said input signal and the inverted input of said second amplifier; and
a third transistor of a first conductivity type for providing said second current, whose emitter is connected to the inverted input of said second amplifier and whose base is connected to the output of said second amplifier so that the base-emitter path of said third transistor constitutes a negative feedback loop and the inverted input of said second amplifier is an imaginary ground, whereby
the magnitude of said second current is substantially zero and said second current causes no shot noise when the amplitude of said input signal is zero.

5. A gain controlled amplifier of claim 1, or 2, wherein said first means includes:
a second amplifier whose non-inverted input is connected to a ground circuit with zero voltage potential;
a second input impedance provided between said input signal and the inverted input of said second amplifier;
a first transistor of a first conductivity type whose base and collector are connected to the inverted input of said second amplifier and whose emitter is connected to the output of said second amplifier so that the base-emitter path of said first transistor constitutes a negative feedback loop and the inverted input of said second amplifier is an imaginary ground;
a second transistor of the first conductivity type for providing said first current, whose base and emitter are respectively connected to the base and emitter of said first transistor so that said first and second transistors constitute a second current mirror circuit; and
a third transistor of the first conductivity type for providing said second current, whose emitter is connected to the inverted input of said second amplifier and whose base is connected to the output of said second amplifier so that the base-emitter path of said third transistor constitutes a negative feedback loop and the inverted input of said second amplifier is an imaginary ground, whereby
the magnitude of said first and second currents is substantially zero and said first and second currents cause no shot noise when the amplitude of said input signal is zero.

6. A gain controlled amplifier of claim 1, or 2, wherein said fifth means includes:
a third amplifier whose non-inverted input is provided with a given voltage potential, whose inverted input receives said first and second attenuated currents and whose output delivers said output signal; and
a feedback impedance connected between the inverted input and the output of said third amplifier.

7. A gain controlled amplifier of claim 1, or 2, wherein said third means includes a first differential transistors pair of a first conductivity type whose bases receive said control signal; and wherein
said second means includes a second differential transistors pair of the first conductivity type whose bases receive said control signal; and a third current mirror circuit coupled with one collector circuit of said first differential transistors pair and one collector circuit of said second differential transistors pair, for changing the flow direction of said first attenuated current so that the phase of said first attenuated current is anti-phased from said second attenuated current, said third current mirror circuit including a second conductivity type transistors pair.

8. A gain control amplifier comprising:
(a) a signal source means for providing a first signal corresponding to the positive component of an input signal and a second signal corresponding to the negative component of said input signal;

(b) an attenuator means connected to said signal source means for attenuating said first and second signals and providing a first and second attenuated signals in accordance with a control signal;

(c) a signal inverter means connected to said attenuator means, for inverting said first attenuated signal to an inverted signal; and (d) a signal composing means connected to said attenuator means and said signal inverter means, for composing said second attenuated signal and said inverted signal to provide an output signal, wherein a transfer function of the gain controlled amplifier is changed by said control signal.

9. A gain controlled amplifier of claim 8, further comprising:

a signal converter means connected to said signal source means and said attenuator means, for converting said input signal to an input current and providing said input current to said signal source means, wherein said signal converter means receives a third signal corresponding to a difference between said first signal and said first attenuated signal and a fourth signal corresponding to a difference between said second signal and said second attenuated signal.

10. A gain controlled amplifier of claim 8 or 9, wherein said attenuator means includes a differential transistors pair of which common emitters receive said first signal and one of which collector provides said first attenuated signal.

11. A gain controlled amplifier of claim 8 or 9, wherein said attenuator means includes a differential transistors pair of which common emitters receive said second signal and one of which provide said second attenuated signal.

* * * * *